DemoStrip

(12) United States Patent
Kim

(10) Patent No.: US 11,087,999 B2
(45) Date of Patent: Aug. 10, 2021

(54) BUFFER CHAMBER UNIT FOR WAFER PROCESSING EQUIPMENT

(71) Applicant: SNW COMPANY LIMITED, Gyeonggi-do (KR)

(72) Inventor: Taehoon Kim, Gyeonggi-do (KR)

(73) Assignee: SNW COMPANY LIMITED, Gyeonggi-do (KR)

( * ) Notice: Subject to any disclaimer, the term of this patent is extended or adjusted under 35 U.S.C. 154(b) by 13 days.

(21) Appl. No.: 16/474,067

(22) PCT Filed: Nov. 10, 2017

(86) PCT No.: PCT/KR2017/012720
§ 371 (c)(1),
(2) Date: Jun. 27, 2019

(87) PCT Pub. No.: WO2018/124462
PCT Pub. Date: Jul. 5, 2018

(65) Prior Publication Data
US 2019/0341282 A1   Nov. 7, 2019

(30) Foreign Application Priority Data

Dec. 30, 2016 (KR) .................... 10-2016-0183299

(51) Int. Cl.
*H01L 21/67* (2006.01)
*H01L 21/673* (2006.01)

(52) U.S. Cl.
CPC .. *H01L 21/67201* (2013.01); *H01L 21/67242* (2013.01); *H01L 21/67346* (2013.01)

(58) Field of Classification Search
CPC ......... H01L 21/67201; H01L 21/67242; H01L 21/67346

USPC ........................................ 414/217
See application file for complete search history.

(56) References Cited

U.S. PATENT DOCUMENTS

| 7,073,999 B2 * | 7/2006 | Oyama | H01L 21/67369 206/454 |
| 7,387,484 B2 * | 6/2008 | Ho | H01L 21/67167 414/217 |
| 2014/0271085 A1 * | 9/2014 | Gajendra | H01L 21/68 414/757 |

FOREIGN PATENT DOCUMENTS

| JP | 2003142552 | 5/2003 |
| JP | 2010050458 | 3/2010 |
| JP | 2013033965 | 2/2013 |
| KR | 2019970015307 | 4/1997 |
| KR | 2019970059843 | 11/1997 |
| KR | 1020040080024 | 9/2004 |
| KR | 1020070051195 | 5/2007 |
| KR | 1020130109680 | 10/2013 |
| KR | 1020140038280 | 3/2014 |

OTHER PUBLICATIONS

"International Search Report (Form PCT/ISA/210) of PCT/KR2017/012720," dated Mar. 13, 2018, with English translation thereof, pp. 1-4.

* cited by examiner

*Primary Examiner* — Dean J Kramer
*Assistant Examiner* — Willie Berry, Jr.
(74) *Attorney, Agent, or Firm* — JCIPRNET

(57) ABSTRACT

The present invention relates to a buffer chamber unit for wafer processing equipment.

2 Claims, 12 Drawing Sheets

BUFFER CHAMBER UNIT FOR WAFER PROCESSING EQUIPMENT

TECHNICAL FIELD

Embodiments relate to a buffer chamber unit for wafer processing equipment

RELATED ART

Wafer processing equipment relates to processing, for example, depositing, exposing, etching, and cleaning, a wafer for manufacturing a semiconductor. Examples of the wafer processing equipment may be provided in the following patent documents.

A buffer chamber unit is applied to the wafer processing equipment with a load lock chamber unit, a transfer chamber unit, a process chamber unit, and an equipment front end module (EFEM) unit.

A load port is installed in the EFEM unit. Through the load port, a wafer may be provided to the wafer processing equipment or the wafer of which process is completed may be taken to an outside. The load lock chamber unit is configured to pass the wafer between the EFEM unit and the transfer chamber unit. The transfer chamber unit is embedded with a robot arm and is configured to place the wafer provided through the load lock chamber unit in the process chamber unit or returns the process completed wafer to the EFEM unit through the load lock chamber unit. The process chamber unit is configured to perform an etching process for the wafer that is provided through the transfer chamber unit.

The buffer chamber unit is connected to the EFEM unit and configured to allow the wafer being transferred between the load lock chamber unit and the load port connected to the EFEM unit to temporarily stay and to remove toxin of the wafer, and to perform buffering functionality between the load lock chamber unit and the EFEM unit.

However, in the case of a conventional buffer chamber unit for wafer processing equipment, when the buffer chamber unit is separated from an EFEM unit in response to requirement for an operation, for example, a repair operation such as cleaning, and a replacement operation, for the buffer chamber unit, the EFEM unit is open to the outside and the wafer processing equipment itself needs to be stopped accordingly. That is, the process efficiency is greatly degraded.

Also, in the case of the conventional buffer chamber unit for wafer processing equipment, when the buffer chamber unit is reconnected to an EFEM unit after completing an operation, for example, a repair operation such as cleaning, and a replacement operation, for the buffer chamber unit, a teaching operation for a robot arm included in a transfer chamber unit is required. That is, a correction and verification operation for restarting the wafer processing equipment is required, which also causes a degradation in the process efficiency.

Also, in the case of the conventional buffer chamber unit for wafer processing equipment, when the buffer chamber unit is reconnected to an EFEM unit after completing an operation, for example, a repair operation such as cleaning, and a replacement operation, for the buffer chamber unit, the buffer chamber unit may not accurately recouple with the EFEM unit. That is, a relatively a large amount of time may be used for such recoupling.

Also, in the case of the conventional buffer chamber unit for wafer processing equipment, when there is a need to heat a wafer that is provided to the buffer chamber unit, the wafer may be inegularly heated.

Also, in the case of the conventional buffer chamber unit for wafer processing equipment, an outlet through which air containing toxin, such as fume removed from a wafer place in a buffer chamber unit and outgas used for a process, is discharged is formed on a rear surface of the buffer chamber unit. Therefore, foreign substances, such as toxin and moisture in air flowing from a transfer chamber unit and an EFEM unit, pass through the wafer placed in the buffer chamber unit and are discharged through the outlet. Accordingly, such foreign substances may be on the wafer, which causes faulty.

PRIOR ART DOCUMENT

Patent Document (Patent Document 1) Korean Utility Model Registration No. 20-0125881, registered on Jun. 30, 1998, titled "semiconductor wafer etching device".

(Patent Document 2) Korean Utility Model Publication No. 20-1997-0059843, published on Nov. 10, 1997, titled "wafer etching device".

DETAILED DESCRIPTION

Subject

Embodiments provide a buffer chamber unit for wafer processing equipment that may be separated and recoupled without stopping the wafer processing equipment.

Embodiments also provide a buffer chamber unit for wafer processing equipment that may be separated and recoupled without performing a correction and verification operation for restarting the wafer processing equipment, such as a teaching operation for a component of the wafer processing equipment.

Embodiments also provide a buffer chamber unit for wafer processing equipment that may be accurately and quickly recoupled and may detect a slight change or deformation while running a processing facility.

Embodiments also provide a buffer chamber unit for wafer processing equipment that may uniformly heat a wafer when there is a need to heat the wafer placed in the buffer chamber unit for wafer processing equipment.

Embodiments also provide a buffer chamber unit for wafer processing equipment that may prevent air containing foreign substances discharged from the buffer chamber unit for wafer processing equipment from passing through a wafer placed in the buffer chamber unit for wafer processing equipment.

Solution

According to an aspect, there is provided a buffer chamber unit for wafer processing equipment, which is a buffer between a load port connected to an equipment front end module (EFEM) unit and a load lock chamber unit through connection to the wafer processing equipment.

The buffer chamber unit includes a unit case of which one surface is open with respect to another component of the wafer processing equipment to allow a wafer to enter and exit; a wafer receiving hole formed within the unit case, configured to communicate with the open surface of the unit case to allow the wafer to enter and exit, and to accommodate the wafer; a door member configured to open and close the open surface of the unit case such that the wafer receiving hole is opened and closed with respect to an outside; and a detachable chamber member detachably provided to the unit case and within which the wafer receiving hole is formed.

When the door member is closed between the wafer processing equipment and the unit case in a state in which the unit case is connected to the wafer processing equipment, the detachable chamber member is separable from the unit case.

Effect

In the case of a buffer chamber unit for wafer processing equipment according to an aspect, a door member is applied. Therefore, when the buffer chamber unit for wafer processing equipment needs to be separated from the EFEM unit, the door member may disconnect between the EFEM unit and the buffer chamber unit for wafer processing equipment. Accordingly, without stopping an operation of the wafer processing equipment, separation and recoupling of the buffer chamber unit for wafer processing equipment may be performed. Also, without performing a correction and verification operation for restarting the wafer processing equipment, such as a teaching operation for a component of the wafer processing equipment, separation and recoupling of the buffer chamber unit for wafer processing equipment may be performed.

MODE

Hereinafter, a buffer chamber unit for wafer processing equipment according to embodiments will be described with reference to the accompanying drawings.

Figure 1:
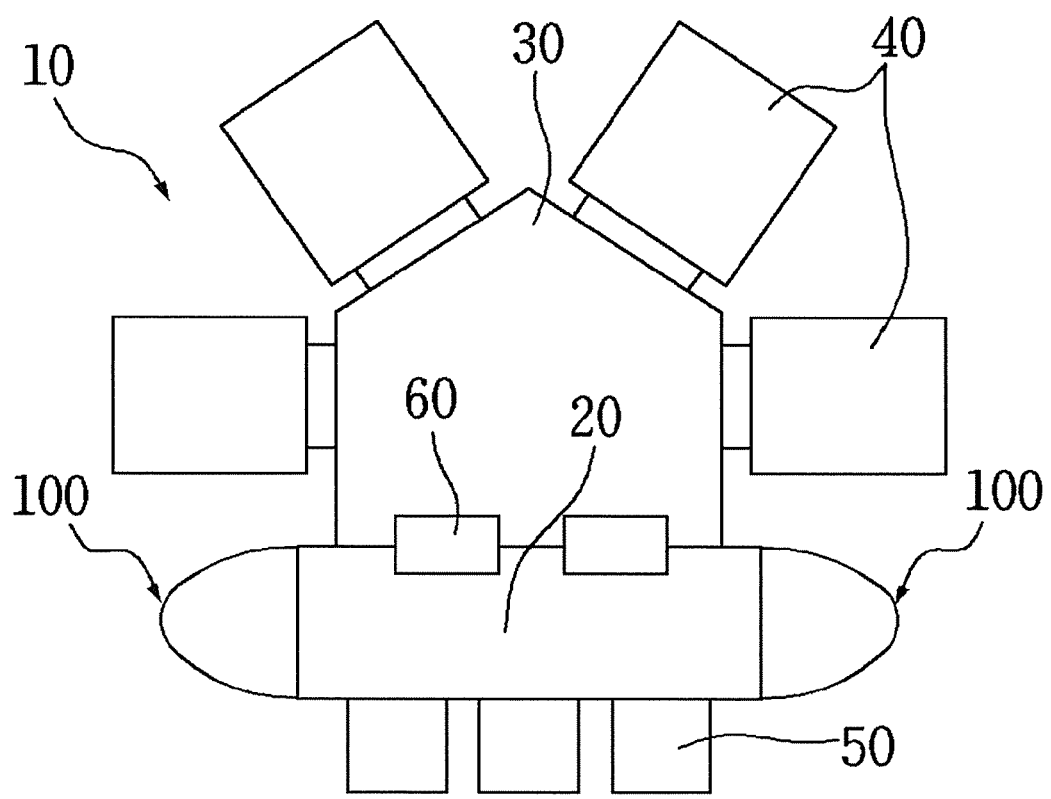
FIG. 1 illustrates wafer processing equipment to which a buffer chamber unit for wafer processing equipment according to a first embodiment is applied.
Figure 2:
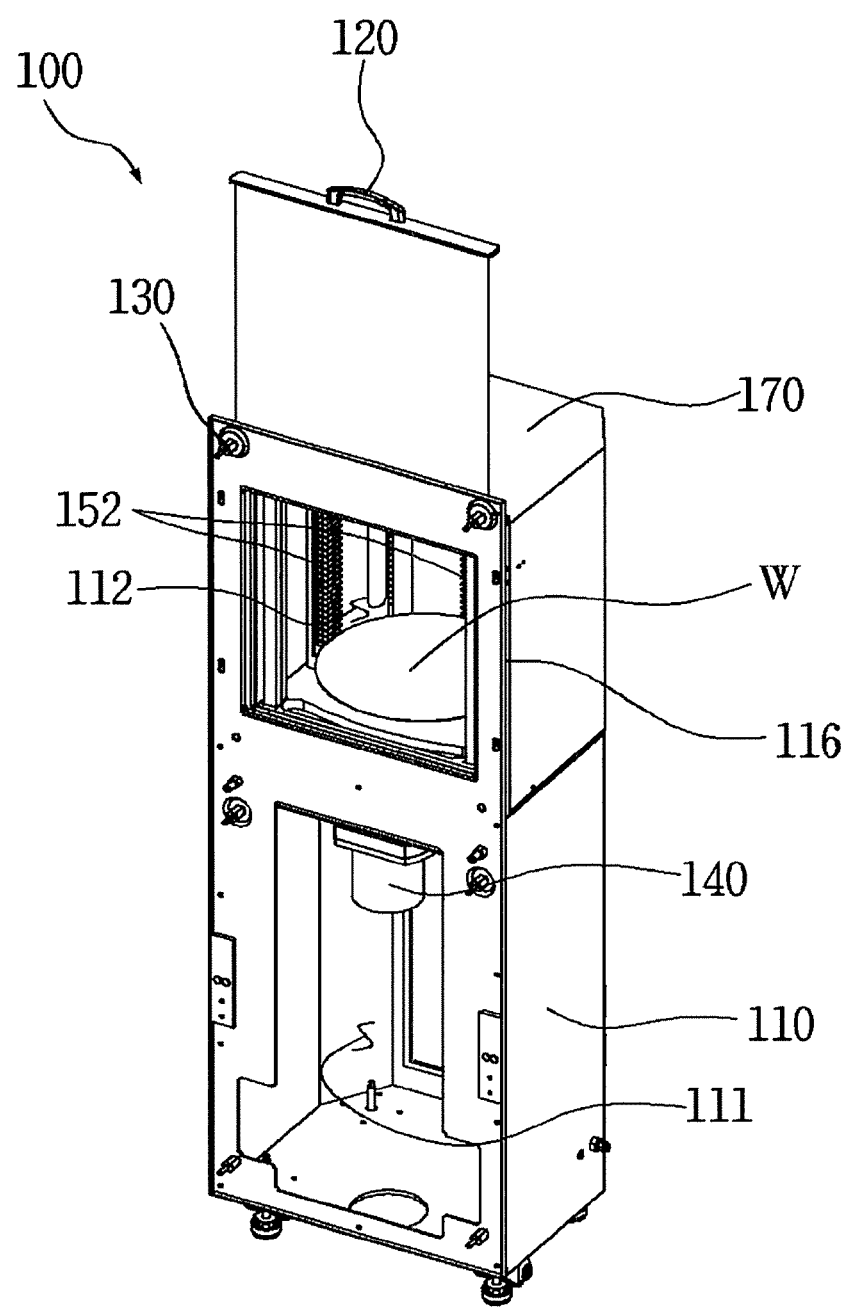
FIG. 2 is a perspective view illustrating a state in which the buffer chamber unit for wafer processing equipment according to the first embodiment is closed.
Figure 3:
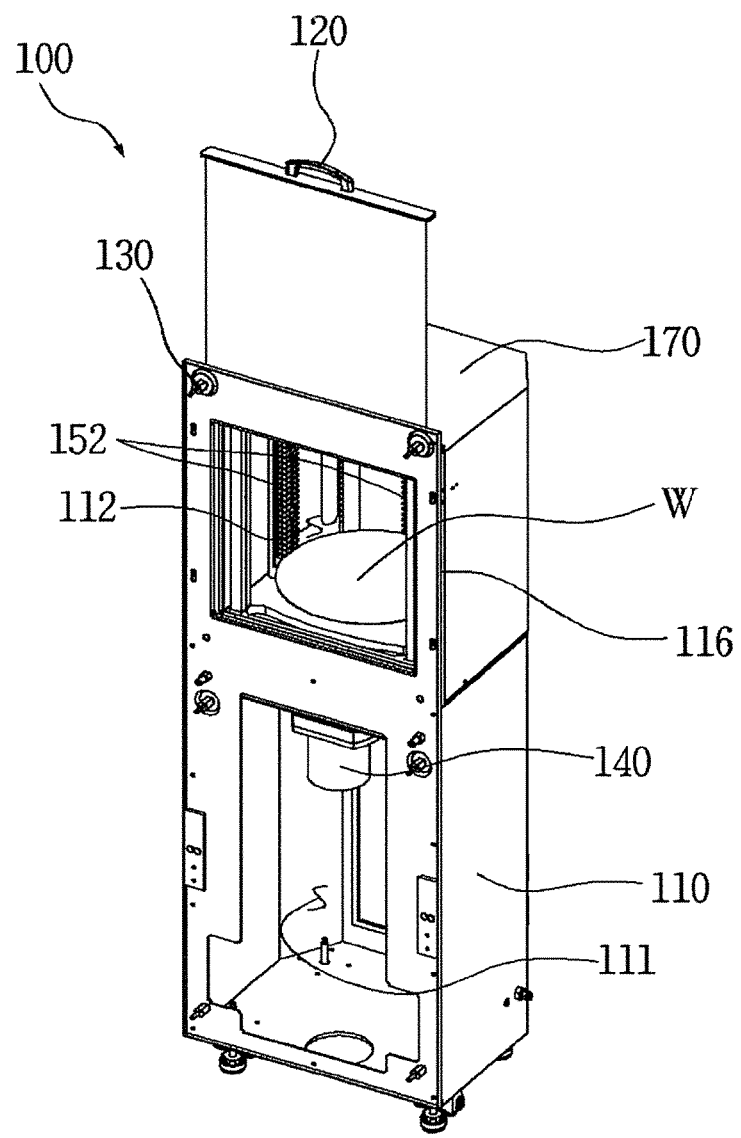
FIG. 3 is a perspective view illustrating a state in which the buffer chamber unit for wafer processing equipment according to the first embodiment is open.
Figure 4:
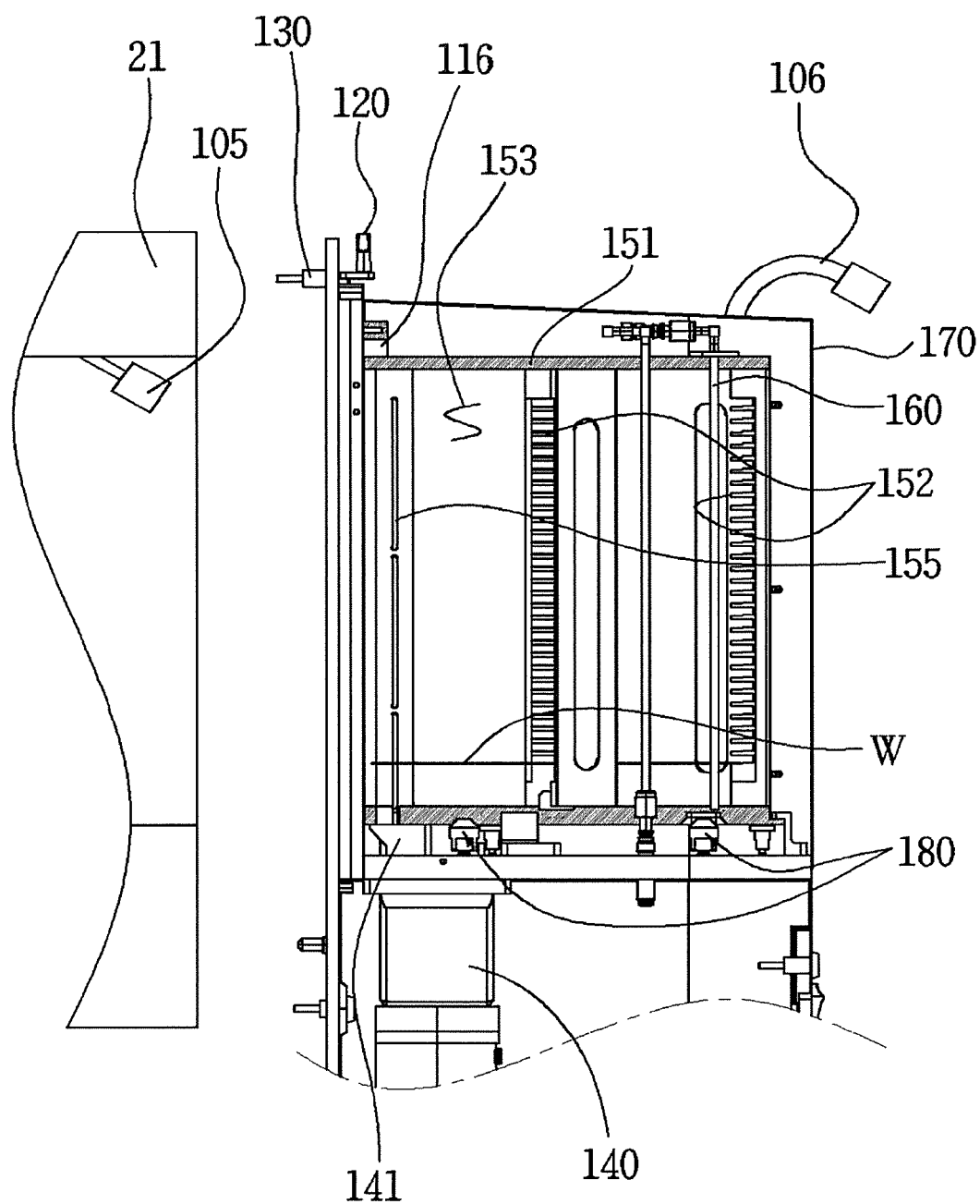
FIG. 4 is a cross-sectional view illustrating a state in which the buffer chamber unit for wafer processing equipment according to the first embodiment is separated.
Figure 5:
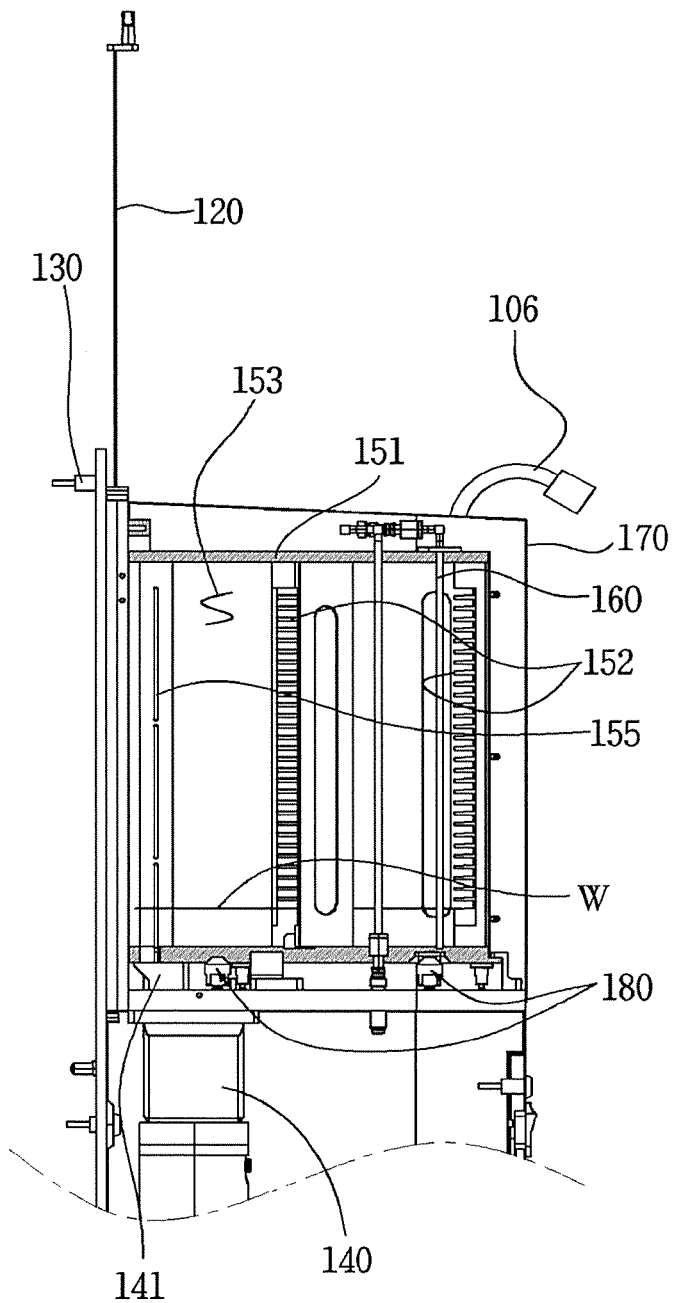
FIG. 5 is a cross-sectional view illustrating a state in which the buffer chamber unit for wafer processing equipment of FIG. 4 is separated and then open.
Figure 6:
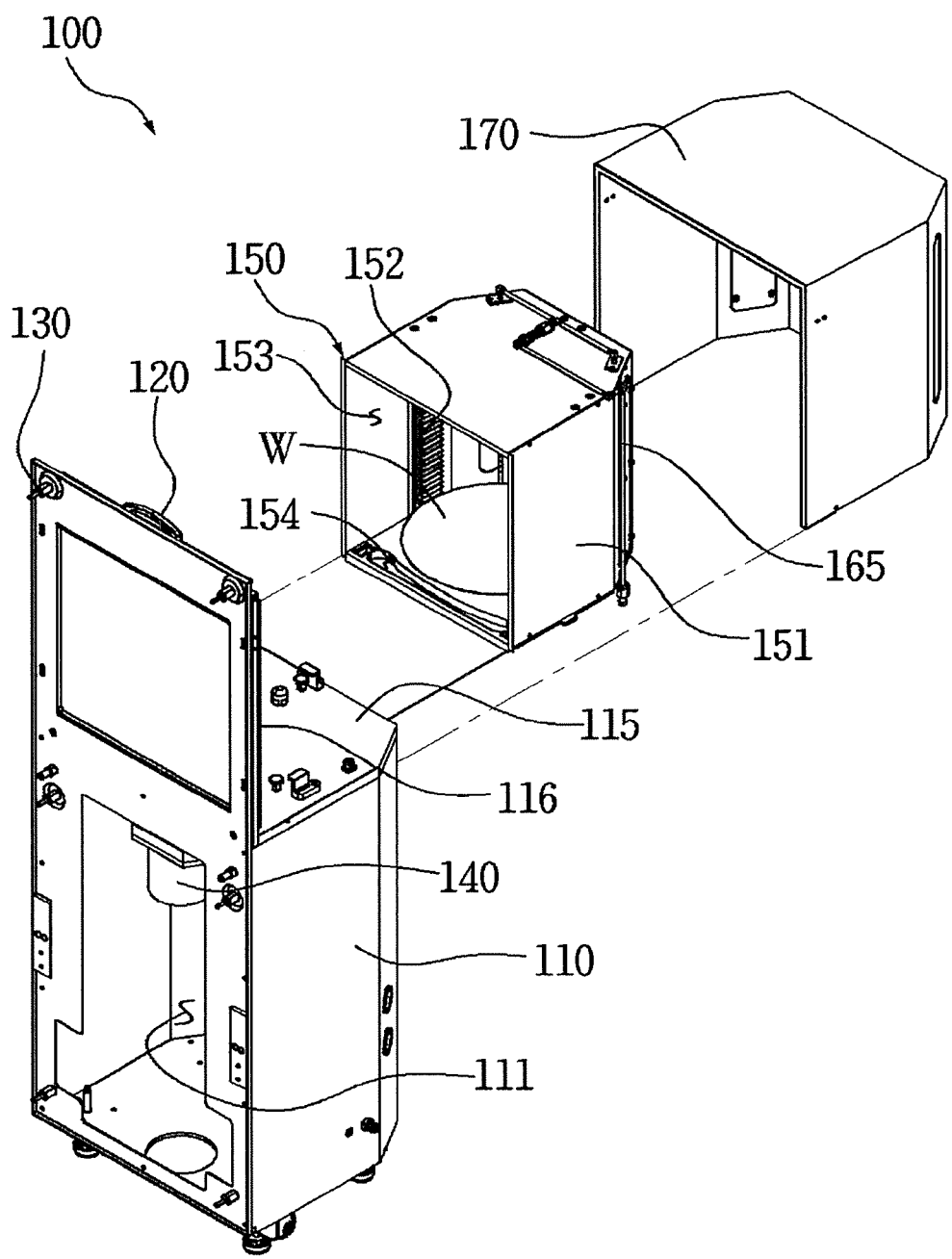
FIG. 6 is an exploded perspective view illustrating the buffer chamber unit for wafer processing equipment according to the first embodiment.
Figure 7:
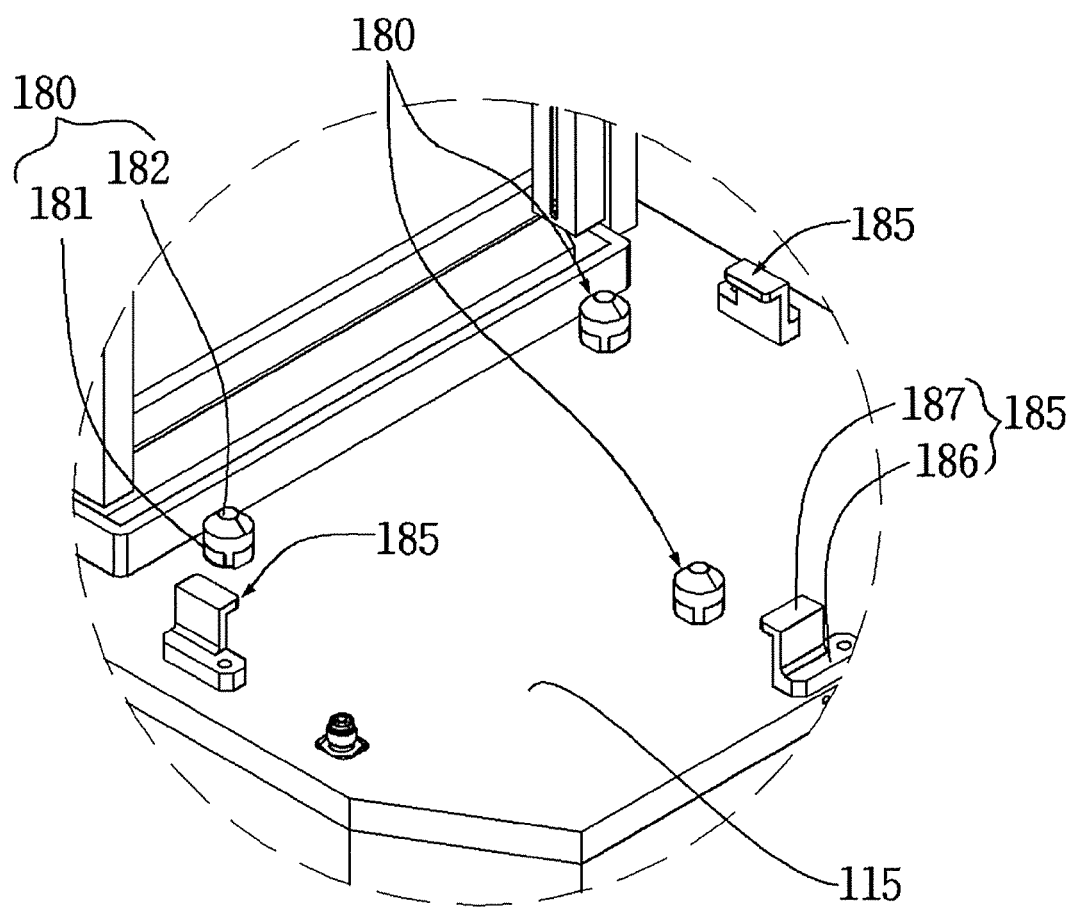
FIG. 7 is an enlarged view illustrating a portion in which a detachable chamber member is placed on a unit case constituting the buffer chamber unit for wafer processing equipment according to the first embodiment.
Figure 8:
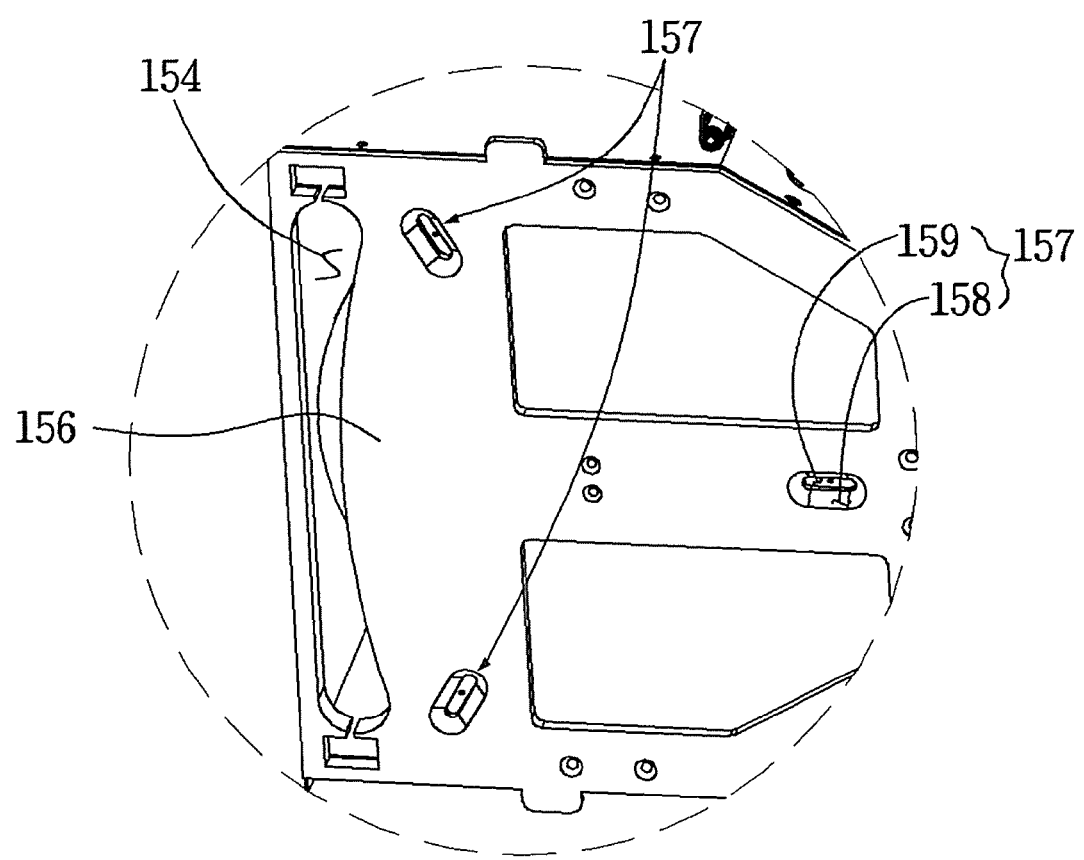
FIG. 8 is an enlarged view illustrating a portion to be placed on a unit case in a detachable chamber member constituting the buffer chamber unit for wafer processing equipment according to the first embodiment.
Figure 9:
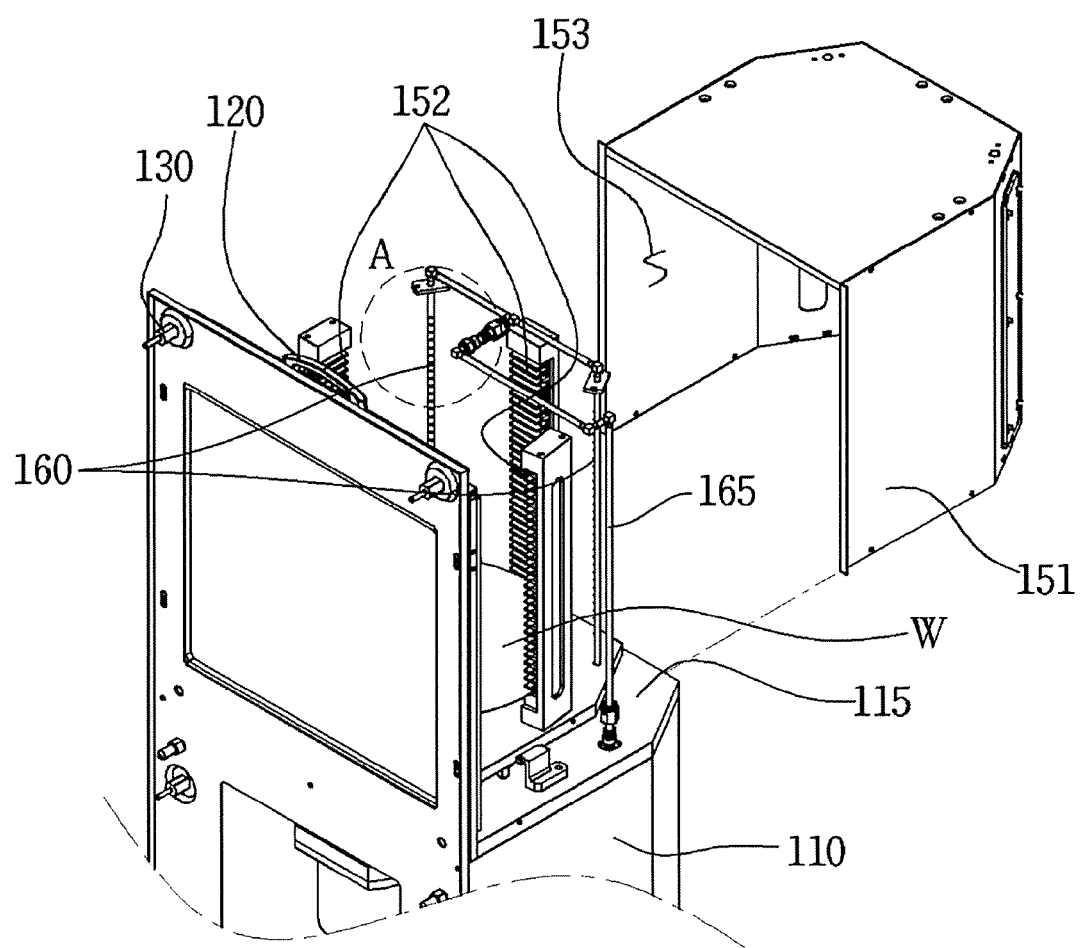
FIG. 9 is an exploded perspective view illustrating a detachable chamber member constituting the buffer chamber unit for wafer processing equipment according to the first embodiment.
Figure 10:
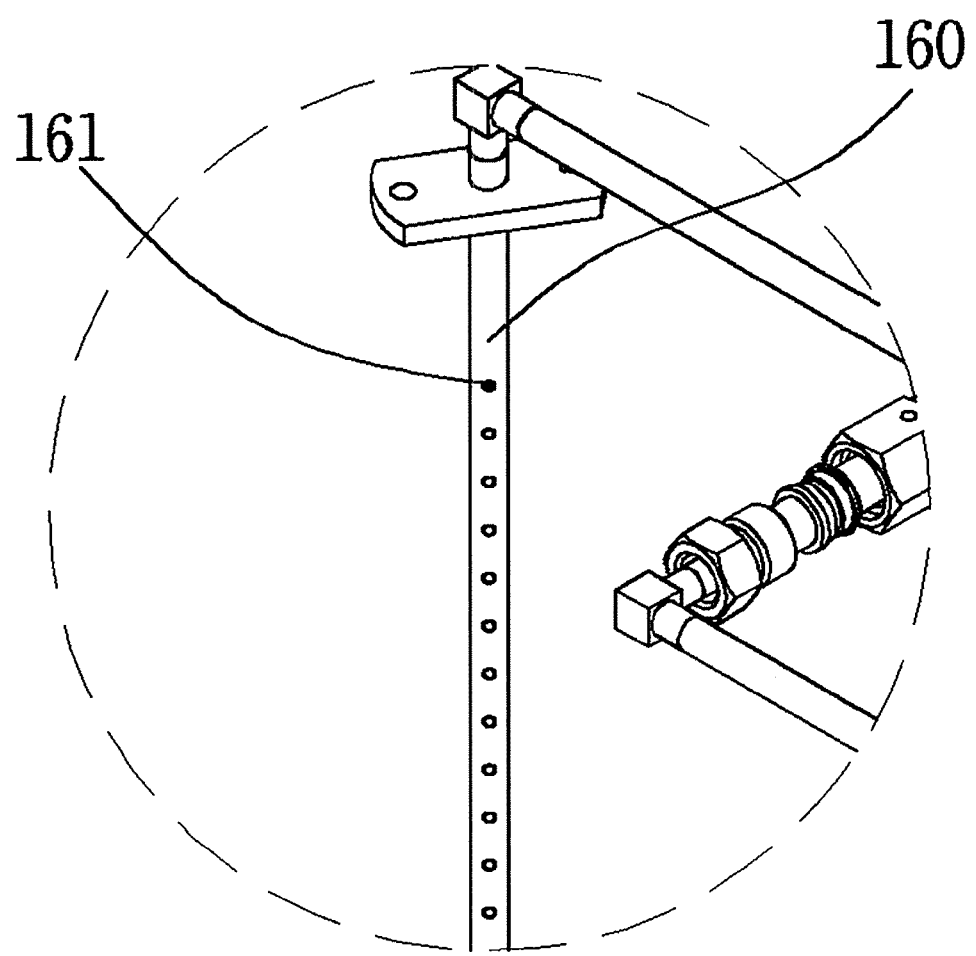
FIG. 10 is an enlarged view illustrating a portion A of FIG. 9.
Figure 11:
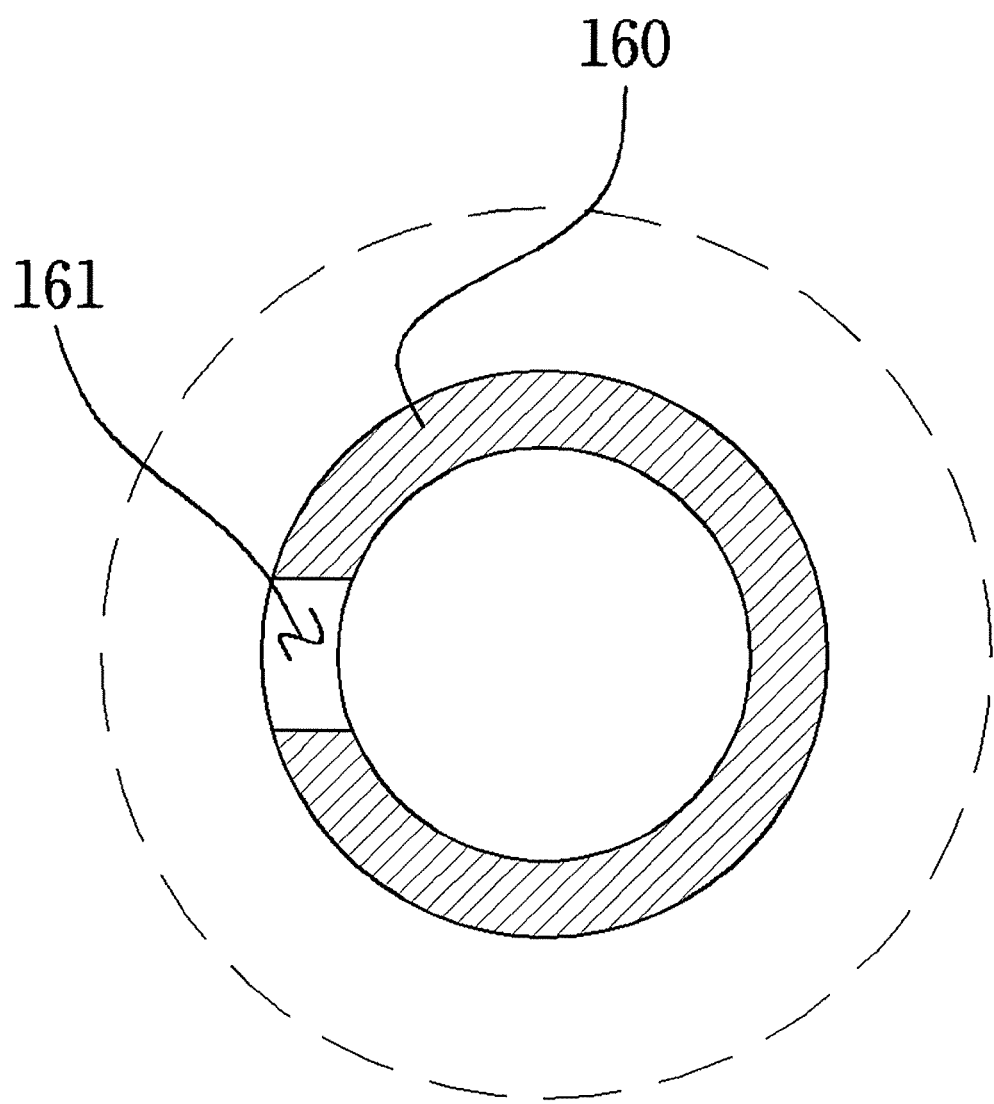
FIG. 11 is a cross-sectional view illustrating an internal supply pipe of FIG. 10.

FIG. 1 illustrates wafer processing equipment to which a buffer chamber unit for wafer processing equipment according to a first embodiment is applied, FIG. 2 is a perspective view illustrating a state in which the buffer chamber unit for wafer processing equipment according to the first embodiment is closed, FIG. 3 is a perspective view illustrating a state in which the buffer chamber unit for wafer processing equipment according to the first embodiment is open, FIG. 4 is a cross-sectional view illustrating a state in which the buffer chamber unit for wafer processing equipment according to the first embodiment is separated, FIG. 5 is a cross-sectional view illustrating a state in which the buffer chamber unit for wafer processing equipment of FIG. 4 is separated and then open, FIG. 6 is an exploded perspective view illustrating the buffer chamber unit for wafer processing equipment according to the first embodiment, FIG. 7 is an enlarged view illustrating a portion in which a detachable chamber member is placed on a unit case constituting the buffer chamber unit for wafer processing equipment according to the first embodiment, FIG. 8 is an enlarged view illustrating a portion to be placed on a unit case in a detachable chamber member constituting the buffer chamber unit for wafer processing equipment according to the first embodiment, FIG. 9 is an exploded perspective view illustrating a detachable chamber member constituting the buffer chamber unit for wafer processing equipment according to the first embodiment, FIG. 10 is an enlarged view illustrating a portion A of FIG. 9, and FIG. 11 is a cross-sectional view illustrating an internal supply pipe of FIG. 10.

Referring to FIGS. 1 to 11, a buffer chamber unit for wafer processing equipment 100 according to the embodiment is a buffer that includes a unit case 110, a wafer receiving hole 153, and a door member 120, and that is present between a load port 50 connected to an equipment front end module (EFEM) unit 20 and a load lock chamber unit 60 through connection to the wafer processing equipment.

The load port 50 is formed on the EFEM unit 20 and a wafer carrier capable of receiving and moving a wafer W is placed on the load port 50.

The EFEM unit 20 enables the wafer carrier to detachably couple with the load port 50 such that the wafer placed in the wafer carrier may be placed in the wafer processing equipment 10 through the load port 50 or may retrieve the wafer of which process is completed and place the retrieved wafer again in the wafer carrier to be taken to an outside.

Reference numeral 30 refers to a transfer chamber unit. The transfer chamber unit 30 is embedded with, for example, a robot arm and is configured to place the wafer that is provided by sequentially passing through the EFEM unit 20 and the load lock chamber unit 60 in a process chamber unit 40, or to return the wafer to the EFEM unit 20.

The wafer passes through the load lock chamber unit 60 is provided between the EFEM unit 20 and the transfer chamber unit 30.

Reference numeral 40 refers to the process chamber unit. The process chamber unit 40 is connected to the transfer chamber unit 30 and configured to perform a processing process of the wafer that is transferred through the transfer chamber unit 30.

Reference numeral 21 refers to a buffer connector that is formed on the EFEM unit 20 and configured to connects the buffer chamber unit for wafer processing equipment 100 to the EFEM unit 20.

The wafer received in the wafer carrier that is connected to the EFEM unit 20 is moved to the process chamber unit 40 through the load lock chamber unit 60 and the transfer chamber unit 30. Once the processing process of the wafer moved to the process chamber unit 40 is completed, the wafer is transported again to the EFEM unit 20 through the transfer chamber unit 30 and the load lock chamber unit 60.

Here, the wafer that moves from the process chamber unit 40 to the EFEM unit 20 through the transfer chamber unit 30 may pass through the buffer chamber unit for wafer processing equipment 100 prior to being received in the wafer carrier. During this process, foreign substances such as toxin may be removed from the wafer.

In the embodiment, the buffer chamber unit for wafer processing equipment 100 includes a detachable chamber member 150 that is detachably provided to the unit case 110 and within which the wafer receiving hole 153 is formed. When the door member 120 is closed between the wafer processing equipment and the unit case 110 in a state in which the unit case 110 is connected to the wafer processing equipment, the detachable chamber member 150 is separable from the unit case 110.

One surface of the unit case 110 is open through an open hole 112 with respect to another component of the wafer processing equipment 10, for example, with respect to the buffer connector 21 of the EFEM unit 20, to allow the wafer to enter and exit In detail, the unit case 110 is in a vertically elongated shape with an empty inside and a plate 115 is formed to traverse an approximately central portion inside the unit case 110, such that the detachable chamber member 150 formed with the wafer receiving hole 153 may be placed on an internal upper portion of the unit case 110.

The wafer receiving hole 153 is formed above the plate 115 within the unit case 110, in detail, inside a detachable body 151 of the detachable chamber member 150. Here, the wafer receiving hole 153 may communicate with the open hole 112 of the unit case 110 to allow the wafer to enter and exit and the wafer may be received.

Here, when the detachable chamber member 150 is integrally formed with the unit case 110 instead of being separate from the unit case 110, the wafer receiving hole 153 may be directly formed on the plate 115 of the unit case 110.

A plurality of slots is vertically formed on an inner wall of the wafer receiving hole 153 inside the detachable body 151 and a wafer container 152 in which a plurality of wafers is stacked through the plurality of slots is installed.

The door member 120 may open and close the open hole 112 of the unit case 110 such that the wafer receiving hole 153 may be open and closed with respect to the outside.

The door member 120 may open and close the open hole 112 of the unit case 110 while ascending along a door guide hole 116 formed in front of the unit case 110, that is, a side surface of the open hole 112 of the unit case 110.

Here, although the door member 120 is described to ascend upward and downward, it is provided as an example only. Various types capable of opening and closing the open hole 112, such as sliding to the left and right, that is, in a lateral direction may be applied, which also belongs to the scope of the invention.

As described above, since the door member 120 is applied, the door member 120 may prevent between the EFEM unit 20 and the buffer chamber unit for wafer processing equipment 100 when there is a need to separate the buffer chamber unit for wafer processing equipment 100 from the EFEM unit 20. In this manner, separation and recoupling of the buffer chamber unit for wafer processing equipment 100 may be performed without stopping an operation of the wafer processing equipment 10. Also, separation and recoupling of the buffer chamber unit for wafer processing equipment 100 may be performed without performing a correction and verification operation for restarting the wafer processing equipment 10, such as a teaching operation for a component of the wafer processing equipment 10.

A lower hole 111 is formed below the plate 115 within the unit case 110 and a discharge pump 140 is installed in the lower hole 111.

The discharge pump 140 is configured to suck and discharge air containing foreign substances within the wafer receiving hole 153. For example, a fan and an air amplifier using a Venturi effect may be applied for the discharge pump 140.

In the embodiment, an outlet 154 configured to discharge the air including foreign substances within the wafer receiving hole 153 to an outside of the wafer receiving hole 153 is formed in the detachable chamber member 150. The outlet 154 is formed on a bottom surface of the detachable chamber member 150. A side discharge body 155 configured to communicate with the outlet 154 and to discharge the air including the foreign substances within the wafer receiving hole 153 with the outlet 154 is formed on each of both side walls on an entrance of the detachable chamber member 150. In this manner, the air including foreign substances, to be discharged from the buffer chamber unit for wafer processing equipment 100, may be discharged through the bottom surface and both side surfaces of the detachable chamber member 150 without passing through the wafer that is placed in the buffer chamber unit for wafer processing equipment 100. Accordingly, the foreign substances included in the air discharged from the buffer chamber unit for wafer processing equipment 100 does not contaminate the wafer.

The outlet 154 may be formed in a shape corresponding to an outline of the wafer to minimize an overlapping portion between the outlet 154 and the wafer. That is, the outlet 154 is positioned in a front bottom surface of the detachable chamber member 150 and has a width that is minimum at a central portion of the detachable chamber member 150 and relatively gradually increases along both sides of the detachable chamber member 150 at a curvature corresponding to a curvature of the wafer. In this manner, the overlapping portion between the outlet 154 and the wafer may be minimized.

Reference numeral 141 refers to a connection pipe that connects the outlet 154 and the discharge pump 140.

In the meantime, the buffer chamber unit for wafer processing equipment 100 includes a detection sensor member 130 configured to detect whether the buffer connector 21 of the EFEM unit 20 that is another component of the wafer processing equipment 10 and the unit case 110 are coupled at a required position and posture.

For example, the detection sensor member 130 is configured as a pressure detection sensor that is installed in the unit case 110 and configured to detect a contact pressure with the buffer connector 21, and detects whether the buffer chamber unit for wafer processing equipment 100 couples with the buffer connector 21 at an accurate position and posture.

In addition, the detection sensor member 130 may include, for example, a level sensor, a vibration detection sensor, a temperature/humidity sensor, and a fume detection sensor.

For accurate detection, a plurality of detection sensor members 130 may be installed at separate positions on the front surface of the unit case 110.

According to the above configuration, an accurate position and posture coupling state between the EFEM unit 20 and the buffer chamber unit for wafer processing equipment 100 may be recognized by the detection sensor member 130. Therefore, recoupling of the buffer chamber unit for wafer processing equipment 100 that is separated from the EFEM unit 20 may be accurately and quickly performed. Also, it is possible to detect a slight change, such as that a connection state of the buffer chamber unit for wafer processing equipment 100 relative to the EFEM unit 20 becomes loose or inclined over time and/or deformation, such as twisting of the buffer chamber unit for wafer processing equipment 100. If the change of the buffer chamber unit for wafer processing equipment 100 is greater than or equal to a predetermined level, a corresponding notification may be displayed on the outside and a preventive preservation may be performed with respect to the slight change or the deformation while running the facility.

An external supply pipe 165 through which a discharge object, such as fussy gas and heat, is supplied from an outside is formed in a vertically elongated shape at an outside of each of both rear corners of the detachable chamber member 150 and an internal supply pipe 160 configured to communicate with the internal supply pipe 160 and to uniformly supply the discharge object supplied from the external supply pipe 165 is formed in a vertically elongated shape at an inside of each of the both rear corners of the detachable chamber member 150.

In the embodiment, a plurality of discharge holes 161 is formed at different heights in the internal supply pipe 160 and each discharge hole 161 is formed to correspond to each corresponding slot of the wafer container 152, such that the discharge object supplied through the internal supply pipe 160 may be uniformly discharged over each wafer inserted into each slot of the wafer container 152 through each corresponding discharge hole 161. Accordingly, if the discharge object is fussy gas, uniform reaction to each wafer may be possible. If the discharge object is air containing heat, each wafer may be uniformly heated.

In addition, an attachable type heater, for example, a silicon rubber heater and a film type heater, is attached to an inside of the detachable chamber member 150. Accordingly, the inside of the detachable chamber member 150 may be uniformly heated.

Reference numeral 170 refers to a protective cover configured to cover and protect the detachable chamber member 150 and may be removed in response to detachment of the detachable chamber member 150.

Reference numeral 105 refers to an internal photographing camera that is provided in the buffer connector 21 and configured to photograph and record the inside of the wafer receiving hole 153. Reference numeral 106 refers to an external photographing camera that is provided to the protective cover 170 and configured to photograph and record the outside of the buffer chamber unit for wafer processing equipment 100. Accordingly, if fault occurs due to an impact applied to the buffer chamber unit for wafer processing equipment 100, a cause of the fault may be verified by analyzing a recording of the internal photographing camera 105 and the external photographing camera 106.

In the embodiment, a guide and fastening protrusion 180 and a guide and fastening groove portion 157 configured to engage with each other for guiding and fastening coupling of the detachable chamber member 150 relative to the plate 115 are formed on the plate 115 and a bottom panel 156 of the detachable chamber member 150 that faces the plate 115. The guide and fastening protrusion 180 and the guide and fastening groove portion 157 are engaged with each other at each of at least three points that are spaced apart from each other.

Here, the guide and fastening protrusion 180 may be formed on the plate 115, and the guide and fastening groove portion 157 may be formed on the bottom panel 156.

Also, each of the guide and fastening groove portions 157 is formed in an elongated shape with a predetermined length. Here, lines that extend from the respective guide and fastening groove portions 157 in a longitudinal direction may be formed to meet at a predetermined point of, for example, a central portion of the bottom panel 156.

The guide and fastening protrusion 180 includes a protrusion body 181 configured to protrude upward from the plate 115 and an upper taper body 182 formed in an upper portion of the protrusion body in a tapered shape that gradually narrows towards an end thereof.

Here, the protrusion body 181 may be provided in a fastened form on the plate 115 and may also be provided in an ascendable form on the plate 115. As an example of the protrusion body 181 in the ascendable form on the plate 115, a screw thread may be formed on an external surface of the protrusion body 181 and an insertion hole (not shown) may be formed in the plate 115. Here, another screw thread capable of engaging with the screw thread formed on the external surface of the protrusion body 181 may be formed on an internal surface of the insertion hole. Accordingly, a height relative to the plate 115 may be adjusted in such a manner that the protrusion body 181 ascends while rotating by external force.

The guide and fastening groove portion 157 includes an insertion groove 158 recessed at a predetermined depth from the bottom panel 156 and formed in a slope shape that gradually narrows towards an end thereof, and a fastening groove 159 to which the upper taper body 182 passes through the insertion groove 158 and then inserts and fastens.

When the detachable chamber member 150 is placed on the plate 115, the guide and fastening protrusions 180 are engaged with the corresponding guide and fastening groove portions 157 at three or more points, respectively. Here, a relatively small upper portion of the upper taper body 182 is guided to a point of a relatively wide entrance of the insertion groove 158, and the upper taper body 182 is guided to slide along a sloped surface of the insertion groove 158 and thereby insert to and thereby fasten to the fastening groove 159. In this case, although the detachable chamber member 150 is approximately placed on the plate 115 such that each guide and fastening protrusion 180 may be engaged with each corresponding guide and fastening groove portion 157 at each of the at least three points, each guide and fastening protrusion 180 may be guided to each corresponding guide and fastening groove portion 157 and thereby accurately and firmly couple therewith. Accordingly, a coupling process of the detachable chamber member 150 may be conveniently, quickly, and accurately performed.

Reference numeral 185 refers to an additional fastening member configured to connect a lower portion of the detachable chamber member 150 and the plate 115 and thereby additionally fasten the detachable chamber member 150 in a state in which each guide and fastening protrusion 180 is fastened to each corresponding guide and fastening groove portion 157.

The additional fastening member 185 includes a pressing portion 187 configured to press and thereby fasten a lower flange portion of the detachable chamber member 150 that is placed on the plate 115 and primarily fastened by each guide and fastening protrusion 180 and each corresponding guide and fastening groove portion 157 and a fastening portion 186 configured to connect to the pressing portion 187 and, here, detachably fasten to the plate 115 using a coupling device, for example, a bolt.

In a state in which the detachable chamber member 150 is placed on the plate 115 and is primarily fastened by each guide and fastening protrusion 180 and each corresponding guide and fastening groove portion 157, the pressing portion 187 is provided to press the lower flange portion of the detachable chamber member 150 and then couples the coupling device with the fastening portion 186 such that the fastening portion 186 may fasten to the plate 115. Accordingly, the detachable chamber member 150 may be additionally fastened by the additional fastening member 185.

Hereinafter, a buffer chamber unit for wafer processing equipment according to another embodiment will be described with reference to the accompanying drawings. In the following, the descriptions made above with the first embodiment will be omitted.

Figure 12:
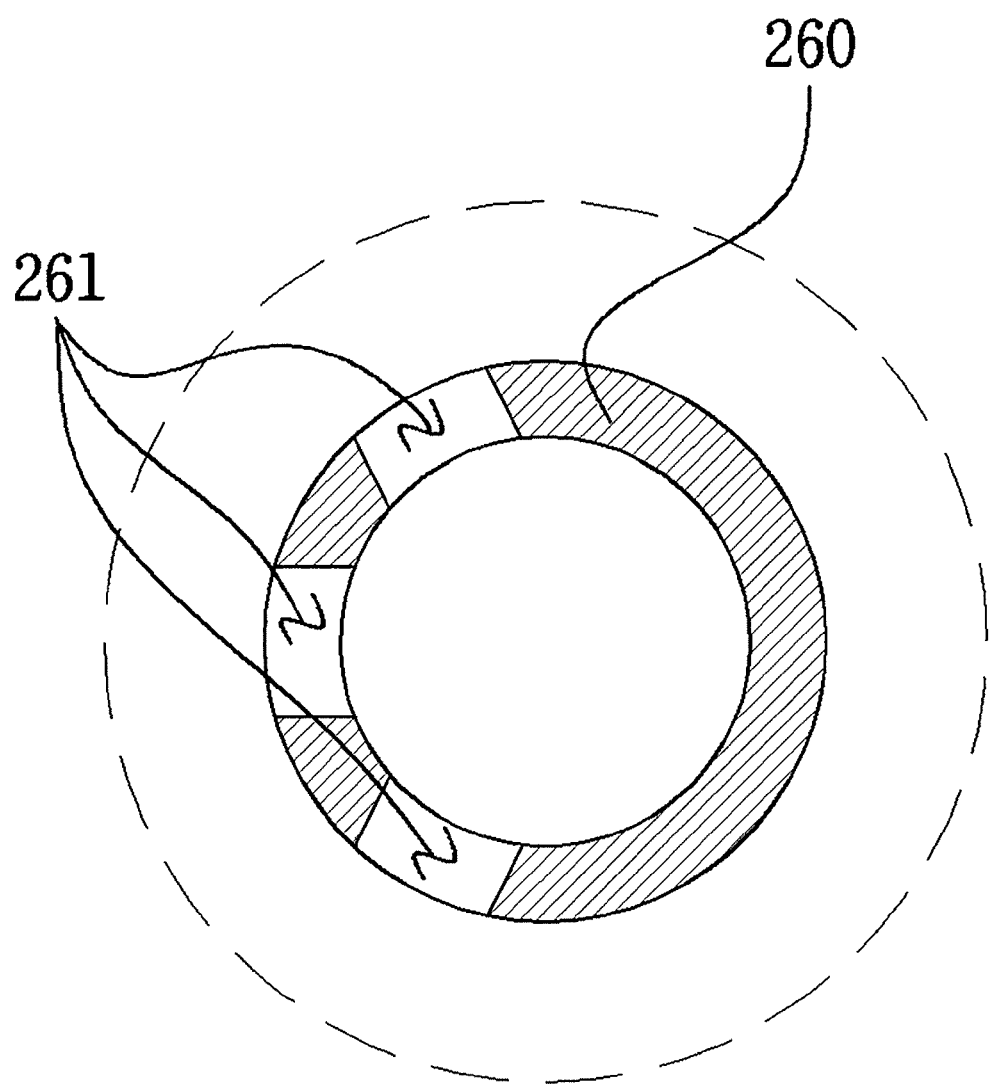
FIG. 12 is a cross-sectional view illustrating an internal supply pipe applied to a detachable chamber member constituting a buffer chamber unit for wafer processing equipment according to a second embodiment.

FIG. 12 is a cross-sectional view illustrating an internal supply pipe applied to a detachable chamber member constituting a buffer chamber unit for wafer processing equipment according to a second embodiment.

Referring to FIG. 12, a plurality of discharge holes 261 at different heights may be formed in an internal supply pipe 260. Here, each discharge hole 216 at the same height may be formed to be plural in different directions.

That is, a discharge hole set in which each discharge hole 261 at the same height is formed to be plural in different directions is formed in the internal supply pipe 260. The discharge hole set is formed at a different height, desirably, a height corresponding to each slot of a wafer container, formed on the internal supply pipe 260.

Through the above configuration, since a discharging object may be discharged at a plurality of points at the same height relative to each wafer inserted into each corresponding slot of the wafer container, it is possible to uniformly supply gas to the wafer and to uniformly heat the wafer.

Although a number of embodiments have been described above, it should be understood by one skilled in the art that various alternations and modifications may be made to the embodiments without departing from the spirit and scope of the following claims. Such alternation and modification structures would be obvious to one skilled in the art are intended to be included within the scope of the embodiments.

INDUSTRIAL APPLICABILITY

In the case of a buffer chamber unit for wafer processing equipment according to an aspect, without stopping an operation of the wafer processing equipment, separation and recoupling of the buffer chamber unit for wafer processing equipment may be performed. Also, without performing a correction and verification operation for restarting the wafer processing equipment, such as a teaching operation for a component of the wafer processing equipment, separation and recoupling of the buffer chamber unit for wafer processing equipment may be performed. Accordingly, the industrial applicability thereof is very high.

FREE TEXT

100: Buffer chamber unit for wafer processing equipment
110: Unit case
112: Wafer receiving hole
120: Door member
130: Detection sensor member

What is claimed is:

1. A buffer chamber unit for wafer processing equipment, which is a buffer between a load port connected to an equipment front end module (EFEM) unit and a load lock chamber unit through connection to the wafer processing equipment, the buffer chamber unit comprising:

a unit case of which one surface is open with respect to another component of the wafer processing equipment to allow a wafer to enter and exit;

a wafer receiving hole formed within the unit case, configured to communicate with the open surface of the unit case to allow the wafer to enter and exit, and to accommodate the wafer;

a door member configured to open and close the open surface of the unit case such that the wafer receiving hole is opened and closed with respect to an outside; and a detachable chamber member detachably provided to the unit case and within which the wafer receiving hole is formed, wherein, when the door member is closed between the wafer processing equipment and the unit case in a state in which the unit case is connected to the wafer processing equipment, the detachable chamber member is separable from the unit case, wherein the unit case comprises a plate, a guide and fastening protrusion and a guide and fastening groove portion configured to engage with each other for guiding and fastening coupling of the detachable chamber member relative to the plate are formed on the plate and on a surface of the detachable chamber member that faces the plate, and the guide and fastening protrusion and the guide and fastening groove portion are configured to engage with each other at each of at least three points separate from each other, the guide and fastening protrusion comprises a protrusion body and an upper taper body formed in an upper portion of the protrusion body in a tapered shape that gradually narrows towards an end thereof, and the guide and fastening groove portion comprises an insertion groove recessed at a predetermined depth and formed in a slope shape that gradually narrows towards an end thereof, and a fastening groove to which the upper taper body passes through the insertion groove and then inserts and fastens, and when the detachable chamber member is placed on the plate, the guide and fastening protrusion engages with the guide and fastening groove portion at each of the at least three points, a relatively small upper portion of the upper taper portion is guided to a point of a relatively wide entrance of the insertion groove, and the upper taper body is guided to slide along a sloped surface of the insertion groove and thereby insert and fasten to the fastening groove.

2. The buffer chamber unit of claim 1, wherein an outlet configured to discharge air containing a foreign substance within the wafer receiving hole to an outside of the wafer receiving hole is formed in the detachable chamber member, and the outlet is formed on a bottom surface of the detachable chamber member, and a side discharge body configured to communicate with the outlet and to discharge the air comprising the foreign substance within the wafer receiving hole with the outlet is formed on each of both side walls on an entrance of the detachable chamber member.

* * * * *